United States Patent
Sasaki et al.

(10) Patent No.: US 11,432,399 B2
(45) Date of Patent: Aug. 30, 2022

(54) TAMPER RESISTANCE WALL STRUCTURE

(71) Applicant: PANASONIC INTELLECTUAL PROPERTY MANAGEMENT CO., LTD., Osaka (JP)

(72) Inventors: Takeyuki Sasaki, Kanagawa (JP); Kyohei Kida, Kanagawa (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 121 days.

(21) Appl. No.: 17/116,716

(22) Filed: Dec. 9, 2020

(65) Prior Publication Data
US 2021/0259100 A1 Aug. 19, 2021

(30) Foreign Application Priority Data
Feb. 13, 2020 (JP) ............................. JP2020-022595

(51) Int. Cl.
 *H05K 1/02* (2006.01)
 *H05K 5/02* (2006.01)
(52) U.S. Cl.
 CPC ......... *H05K 1/0275* (2013.01); *H05K 5/0208* (2013.01); *H05K 5/0247* (2013.01)
(58) Field of Classification Search
 CPC .... G06F 21/86; H05K 1/0275; H05K 5/0208; H05K 5/024
 See application file for complete search history.

(56) References Cited

U.S. PATENT DOCUMENTS

| | | | | |
|---|---|---|---|---|
| 5,675,319 | A * | 10/1997 | Rivenberg | G08B 13/128 340/541 |
| 6,853,093 | B2 * | 2/2005 | Cohen | H01L 23/576 257/679 |
| 2008/0028168 | A1 | 1/2008 | Muraoka | |
| 2008/0129501 | A1 * | 6/2008 | Tucker | G08B 13/06 340/550 |
| 2015/0277501 | A1 | 10/2015 | Sugiyama et al. | |

FOREIGN PATENT DOCUMENTS

| | | |
|---|---|---|
| JP | 2008-033593 | 2/2008 |
| JP | 2008-098273 | 4/2008 |
| JP | 2013-003979 | 1/2013 |
| JP | 2015-191536 | 11/2015 |
| JP | 2018-060417 | 4/2018 |

* cited by examiner

*Primary Examiner* — James Wu
(74) *Attorney, Agent, or Firm* — Greenblum & Bernstein, P.L.C.

(57) ABSTRACT

A tamper resistance wall structure on a circuit board includes a wall body formed of a laminated board, and a tamper detection wiring provided in the wall body. An outer through hole is provided in an outer surface of the wall body, which is a side surface away from a protective area on the circuit board, and is formed perpendicular to a longitudinal direction of the outer surface and perpendicular to the circuit board. An inner through hole is provided in an inner surface of the wall body, which is a side surface close to the protective area on the circuit board, and is formed perpendicular to a longitudinal direction of the inner surface and perpendicular to the circuit board. A recess is formed on the inner surface, and the inner through hole is formed in the recess and is a part of the tamper detection wiring.

5 Claims, 6 Drawing Sheets

TAMPER RESISTANCE WALL STRUCTURE

CROSS-REFERENCE TO RELATED APPLICATIONS

This application is based on and claims priority under 35 USC 119 from Japanese Patent Application No. 2020-022595 filed on Feb. 13, 2020, the contents of which are incorporated herein by reference.

TECHNICAL FIELD

The present disclosure relates to a tamper resistance wall structure and an information processing device.

BACKGROUND ART

In recent years, the introduction of settlement terminals that provide electronic settlements to users has been promoted in stores and commercial facilities. The settlement terminals handle secret information such as a credit card number, identification information of an IC card, personal information of a user, and a secret key used for encrypting information in the internal processing. Therefore, the information processing device that executes the internal processing of the settlement terminal includes a tamperproof mechanism for resisting a physical attack (tamper) from the outside for the purpose of analyzing or falsifying secret information.

Patent Literature 1 discloses an information processing device including first and second circuit boards disposed on a device wall body in a state of being separated from each other, electronic components disposed on opposite surfaces of the first and second circuit boards respectively, a shielding member surrounding an outer periphery of the first and second circuit boards and including a detection line on an inner surface, and a tamper detection unit. When the tamper detection unit detects a tamper based on a damage of a detection line, the tamper detection unit erases the data in the memory. As a result, the secret information in the memory is prevented from being analyzed.

Patent Literature 2 discloses a data storage device including sufficiently thin electric wires which are wired so as to cover almost the entire surface of a housing at a sufficiently narrow interval, a tamper detection unit that detects disconnection of the electric wire, and a memory provided in the housing. The tamper detection unit erases the data in the memory in a case where the disconnection of the electric wire is detected. As a result, the secret information in the memory is prevented from being analyzed.

CITATION LIST

Patent Literature

Patent Literature 1: JP-A-2013-3979
Patent Literature 2: JP-A-2008-33593

SUMMARY OF INVENTION

As described above, the information processing device which handles secret information is required to have physical tamper proof. On the other hand, the information processing device (or the settlement terminal including the information processing device) having tamper proof is also required to be manufactured more efficiently.

An object of the present disclosure is to provide a tamper resistance wall structure capable of efficiently manufacturing an information processing device having tamper proof and an information processing device including the tamper resistance wall structure.

A tamper resistance wall structure on a circuit board according to the present disclosure includes a wall body that is formed of a laminated board; and a tamper detection wiring that is provided in the wall body, and that is a pattern wiring for tampering detection. An outer through hole is provided in an outer surface of the wall body, which is a side surface away from a protective area on the circuit board, and is formed perpendicular to a longitudinal direction of the outer surface and perpendicular to the circuit board. An inner through hole is provided in an inner surface of the wall body, which is a side surface close to the protective area on the circuit board, and is formed perpendicular to a longitudinal direction of the inner surface and perpendicular to the circuit board. A recess is formed on the inner surface, and the inner through hole is formed in the recess and is a part of the tamper detection wiring.

The information processing device according to the present disclosure includes at least the above tamper resistance wall structure and a circuit board, and the outer through hole and the inner through hole of the tamper resistance wall structure are soldered to the circuit board.

According to the present disclosure, a tamper resistance wall structure capable of efficiently manufacturing an information processing device having tamper proof and an information processing device including the tamper resistance wall structure can be provided.

BRIEF DESCRIPTION OF DRAWINGS

FIG. 1A is a top view, FIG. 1B is a side view, and FIG. 1C is a front view.

DESCRIPTION OF EMBODIMENTS

Hereinafter, embodiments of the present disclosure will be described in detail with reference to the drawings as appropriate. However, unnecessarily detailed description may be omitted. For example, detailed description of well-known matters and repeated description of substantially the same configurations may be omitted. This is to avoid unnecessary redundancy in the following description and to facilitate understanding of those skilled in the art. The accompanying drawings and the following description are provided for those skilled in the art to fully understand the present disclosure, and are not intended to limit the subject matter of the claims.

Present Embodiment

Settlement Terminal

Figure 1A:
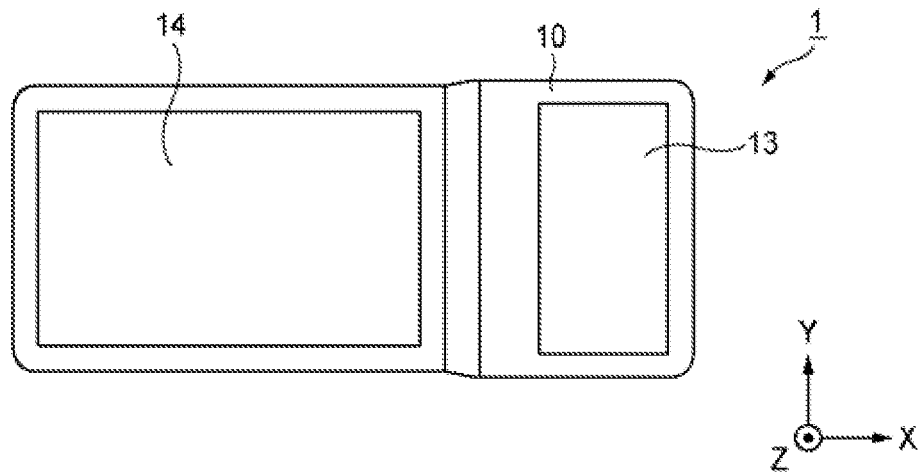
FIGS. 1A to 1C are views showing a configuration example of a settlement terminal according to the present embodiment.
Figure 1B:
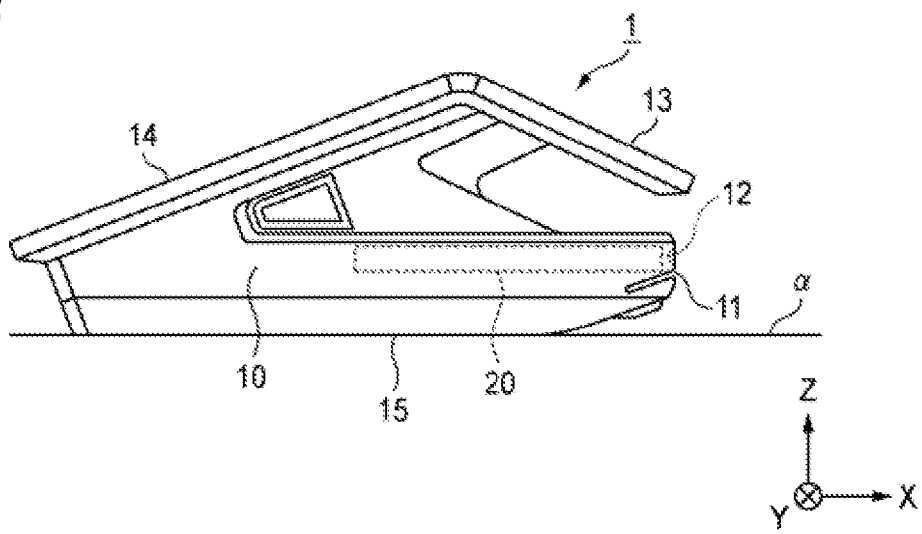
Figure 1C:
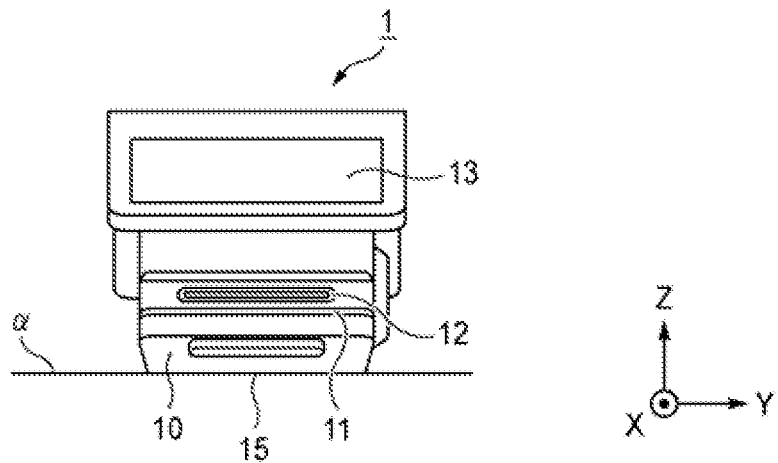

FIGS. 1A to 1C are views showing a configuration example of a settlement terminal according to the present embodiment, FIG. 1A is a top view, FIG. 1B is a side view, and FIG. 1C is a front view.

The settlement terminal 1 is a terminal corresponding to at least an electronic settlement, and is placed and used on a placement surface a such as a counter of a store, for example. As shown in FIG. 1A, the settlement terminal 1 includes a substantially box-shaped housing 10.

The settlement terminal 1 may be a composite type settlement terminal capable of selecting a plurality of settlement methods by a user who performs electronic settlement. The settlement terminal 1 includes a settlement mechanism for a user to select a settlement method and perform settlement. For example, as shown in FIG. 1C, the settlement terminal 1 includes, as a settlement mechanism, a slot 11 for settlement of a magnetic card, a slot 12 for settlement of a contact IC card, and a touch surface 13 for contact-less settlement, in this order from a bottom surface 15 upward on one end side of the housing 10. In addition, the settlement terminal 1 includes an operation mechanism for an employee and the like of the store to perform settlement approval and the like. For example, as shown in FIG. 1B, the settlement terminal 1 includes, as an operation mechanism, an operation screen 14 on the other end side of the housing 10 (that is, on the opposite side of the settlement mechanism).

For example, a user inserts and slides a magnetic card into the slot 11 for magnetic card settlement. The user inserts a contact IC card 16 into the slot 12 for settlement of the contact IC card. The user holds a contact-less type IC card over the touch surface 13 for contact-less settlement. The employee of the store operates the operation screen 14 of the settlement terminal 1 to determine the card settlement of the user.

The settlement terminal 1 includes an information processing device 20 for performing settlement processing inside the housing 10. The information processing device 20 which handles secret information such as settlement processing is required to have high security against physical attacks from the outside. That is, the information processing device 20 is required to have high tamper proof. On the other hand, in view of the cost of introduction of the settlement terminal 1 into the store, the information processing device 20 is also required to be manufactured more efficiently. The information processing device 20 that achieves both high tamper proof and manufacturing efficiency will be described below.

For convenience of description, as shown in FIGS. 1A to 1C, an axis perpendicular to the bottom surface 15 of the housing 10 is defined as a Z axis. An axis perpendicular to the Z axis (that is, parallel to the bottom surface 15 of the housing 10) from the operation mechanism side to the settlement mechanism side of the housing 10 is defined as the X axis. An axis orthogonal to the X axis and the Z axis is defined as a Y axis. For convenience of description, there is a case where the positive direction of the X axis is referred to as "front", the negative direction of the X axis is referred to as "rear", the positive direction of the Y axis is referred to as "right", the negative direction of the Y axis is referred to as "left", the positive direction of the Z axis is referred to as "upper", and the negative direction of the Z axis is referred to as "lower". Note that the expressions relating to these directions are used for convenience of description and are not intended to limit the posture of the structure in actual use.

Information Processing Device

Figure 2:
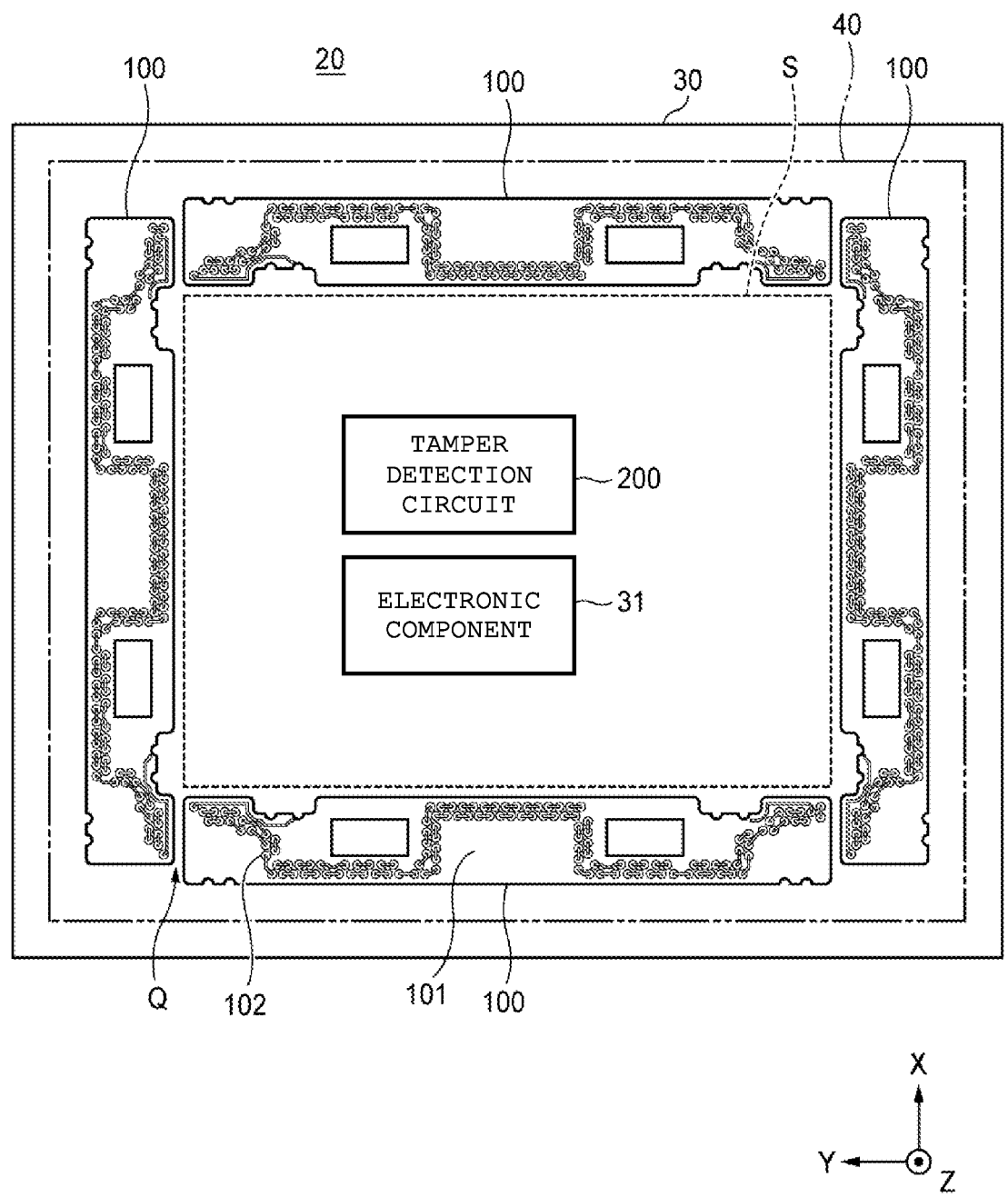
FIG. 2 is a view illustrating a configuration example of an information processing device including a tamper resistance wall structure according to the present embodiment.
Figure 3:
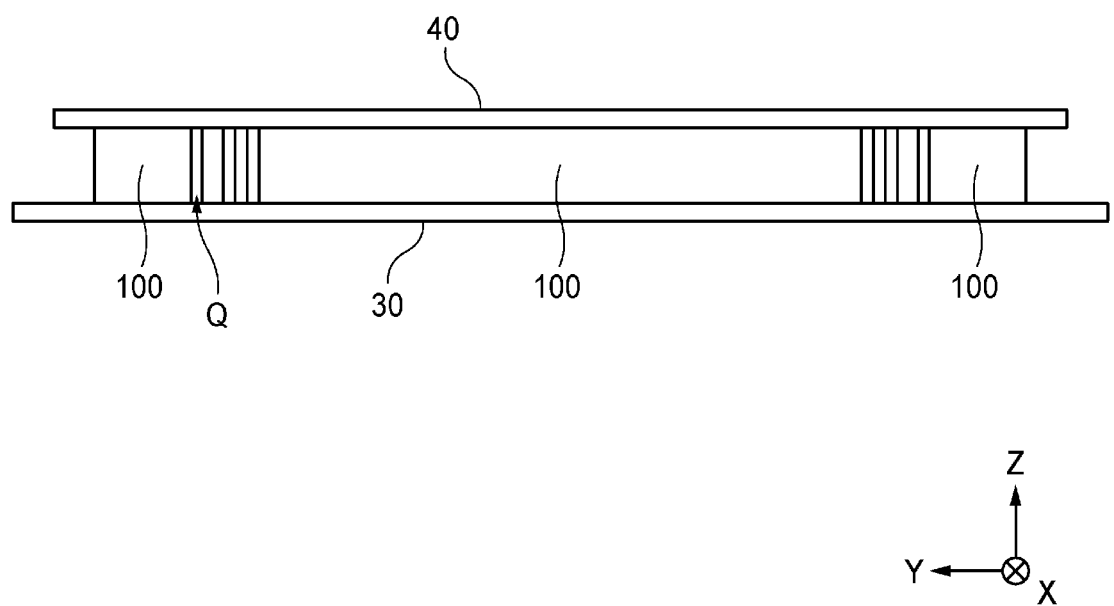
FIG. 3 is a front view of the information processing device including the tamper resistance wall structure according to the present embodiment.

FIG. 2 is a view showing a configuration example of the information processing device 20 including the tamper resistance wall structure according to the present embodiment. FIG. 3 is a front view of the information processing device 20 including the tamper resistance wall structure according to the present embodiment.

The information processing device 20 is, for example, a device that performs settlement processing. However, the present embodiment is not limited to an information processing device that performs settlement processing, and can be applied to various information processing devices that handle secret information.

The information processing device 20 includes a first board 30, a second board 40, and one or more tamper resistance wall structures 100.

The first board 30 is a printed circuit board (PCB), and includes a printed wiring (not shown) and one or more electronic components 31 on a main surface (for example, an upper surface). One of the electronic components 31 may be an IC chip. The IC chip may be a processor, a memory, and a communication IN (Interface), or a combination thereof.

The first board 30 includes a tamper detection wiring (not shown) which is a pattern wiring for attack (tamper) detection with respect to the first board 30. The pattern of the tamper detection wiring may be a pattern that covers the entire surface of the first board 30 in a snake shape with a single stroke. The tamper refers to a physical attack from the outside for the purpose of analyzing or falsifying secret information. An example of the tamper is a probing attack in which an elongated probe is inserted from the outside to analyze or falsify a signal.

The tamper resistance wall structure 100 is a member for constructing a wall extending perpendicularly to the main surface of the first board 30. A wall body 101 of the tamper resistance wall structure 100 is formed of a laminated board. The tamper resistance wall structure 100 includes a tamper detection wiring 102 which is a pattern wiring for tamper detection with respect to the tamper resistance wall structure 100 in the wall body 101. The tamper resistance wall structure 100 is disposed on the main surface of the first board 30 so as to surround the electronic component 31 and the like of the first board 30. For example, as shown in FIG. 2, four tamper resistance wall structures 100 are disposed on the upper surface of the first board 30 so as to surround the electronic component 31 and the like of the first board 30. Details of the tamper resistance wall structure 100 will be described later.

As shown in FIG. 3, the second board 40 is disposed to face the first board 30 with the tamper resistance wall structure 100 sandwiched therein. The second board 40 includes a tamper detection wiring (not shown) which is a pattern wiring for tamper detection with respect to the second board 40. Similarly to the first board 30, the pattern of the tamper detection wiring may be a pattern that covers the entire surface of the second board 40 in a snake shape with a single stroke. The second board 40 may be a printed circuit board. Alternatively, the second board 40 may be a protective board for the purpose of protecting against the tamper.

According to the configuration described above, the electronic component 31 and the like that handles secret information is surrounded and shielded by the first board 30, the second board 40, and the tamper resistance wall structure 100. Hereinafter, a protection target region shielded by the first board 30, the second board 40, and the tamper resistance wall structure 100 is referred to as a protective area S.

The first board 30 or the second board 40 includes a tamper detection circuit 200 that is a circuit for tamper detection in the protective area S. The tamper detection circuit 200 may be realized by an IC chip included in the first board 30 or the second board 40.

The tamper detection wiring of the first board 30 is electrically connected to the tamper detection circuit 200. The tamper detection circuit 200 monitors a signal flowing through the tamper detection wiring of the first board 30, and detects a disconnection and a short circuit of the tamper detection wiring. The tamper detection circuit 200 also monitors signals for the tamper detection wiring 102 of the tamper resistance wall structure 100 and the tamper detection wiring of the second board 40 in the same manner, and detects disconnections and short circuits.

When a disconnection or a short circuit of the tamper detection wiring is detected, the tamper detection circuit 200 performs a process for preventing the analysis and falsification of the secret information. For example, the tamper detection circuit 200 stops the operation of the IC chip and erases the information in the memory.

Accordingly, the tamper with respect to the protective area S by the attacker can be prevented. For example, in a case where an attacker inserts a probe into the first board 30, the tamper resistance wall structure 100, or the second board 40, the tamper detection wiring is cut or short-circuited, and as described above, the tamper detection circuit 200 stops the operation of the IC chip and erases the information in the memory. Therefore, the attacker cannot analyze and falsify the signals of the IC chip and the printed wiring disposed on the protective area S, and cannot analyze and falsify the secret information in the memory.

Tamperproof Wall

Figure 4:
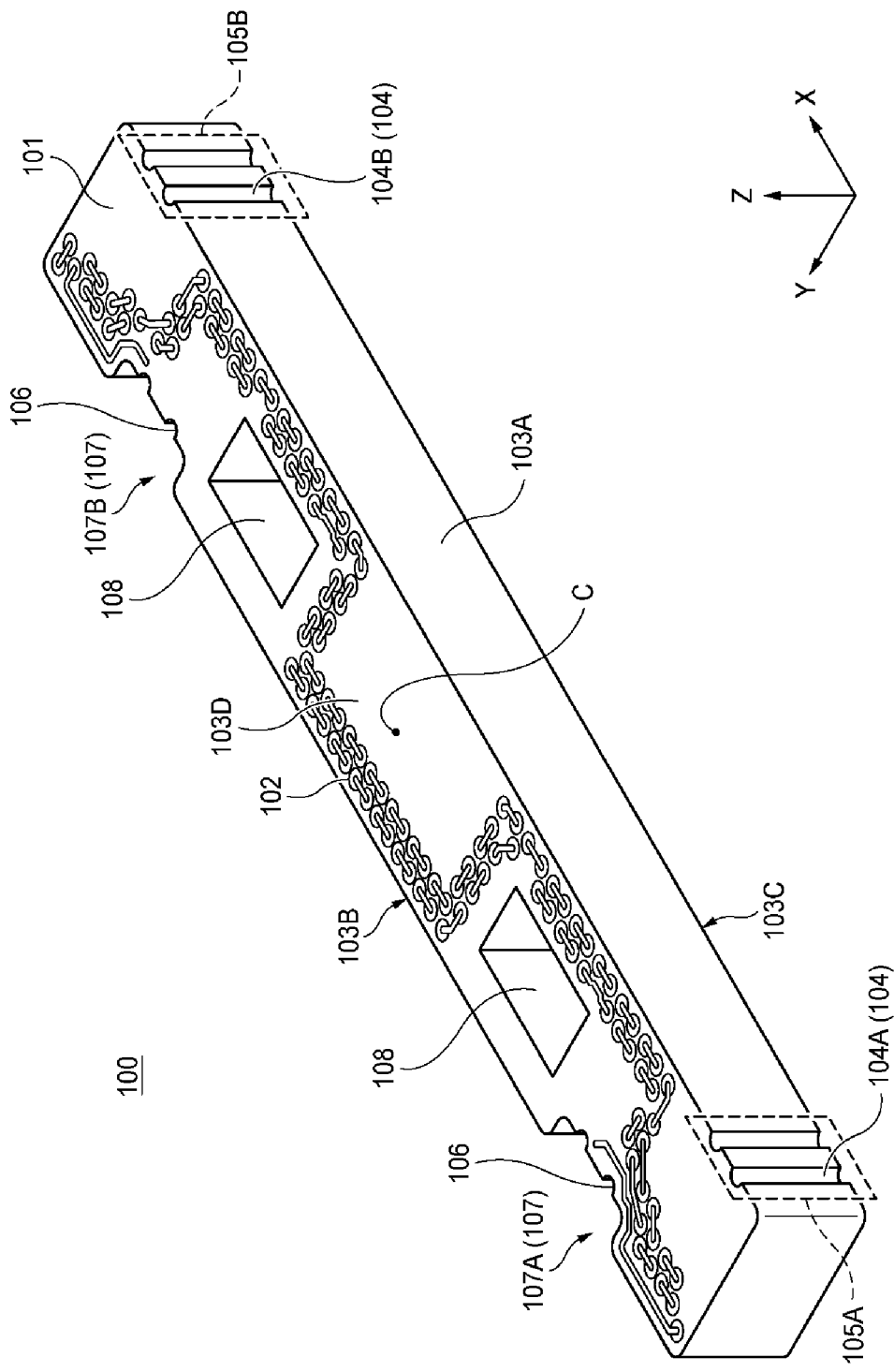
FIG. 4 is a perspective view of the tamper resistance wall structure viewed obliquely from above with an outer surface facing the front according to the present embodiment.
Figure 5:
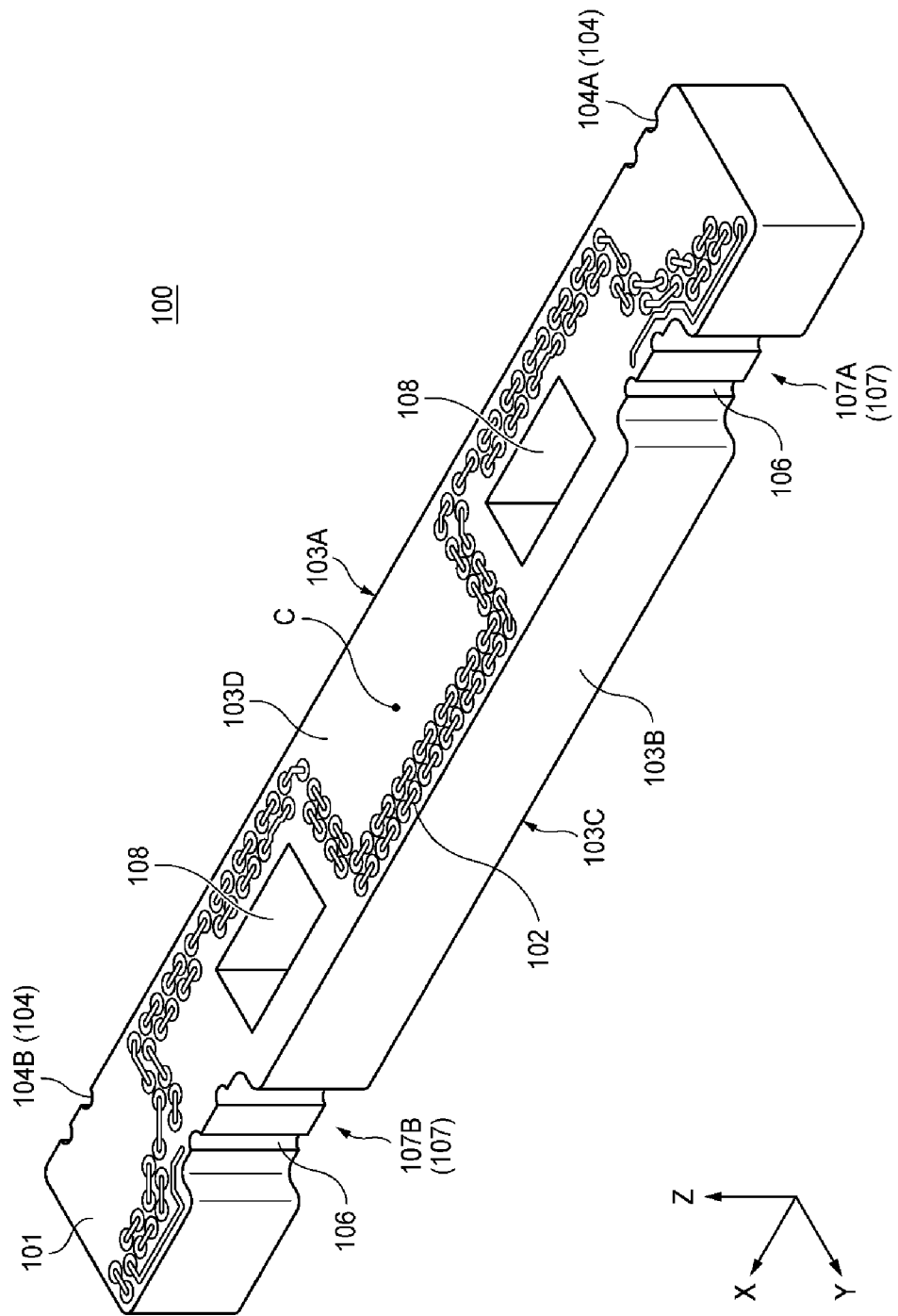
FIG. 5 is a perspective view of the tamper resistance wall structure viewed obliquely from above with an inner surface facing the front according to the present embodiment.
Figure 6:
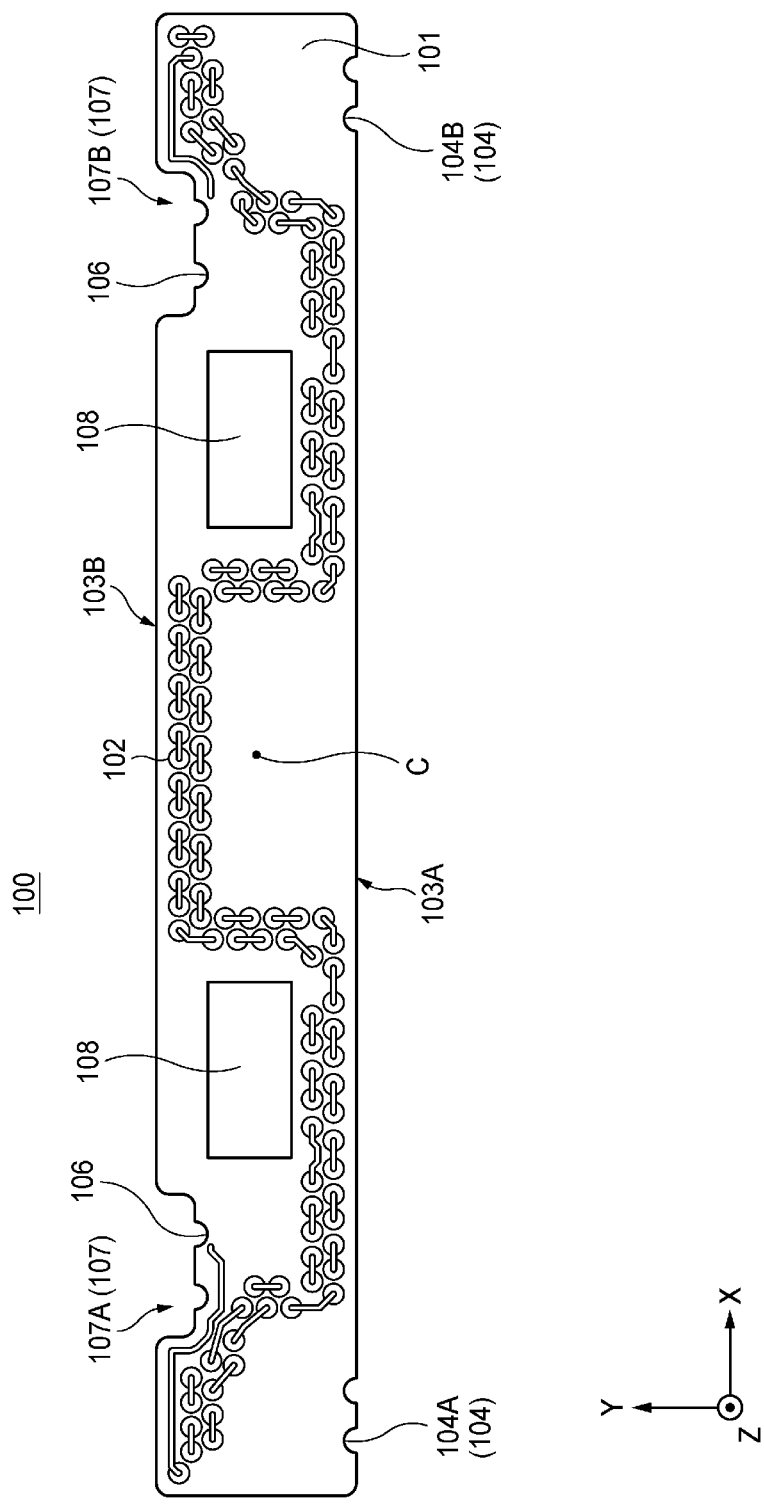
FIG. 6 is a top view of the tamper resistance wall structure according to the present embodiment.

FIGS. 4, 5, and 6 are views showing a configuration example of the tamper resistance wall structure 100 according to the present embodiment. FIG. 4 is a perspective view of the tamper resistance wall structure 100 viewed with the outer surface facing the front. FIG. 5 is a perspective view of the tamper resistance wall structure 100 viewed with the inner surface facing the front. FIG. 6 is a top view of the tamper resistance wall structure 100.

Next, the tamper resistance wall structure 100 will be described in detail with reference to FIGS. 4 to 6. The tamper resistance wall structure 100 exhibits a horizontally long substantially rectangular parallelepiped shape. In the description of the tamper resistance wall structure 100, of two side surfaces of the tamper resistance wall structure 100 in the longitudinal direction, a side surface farther from the protective area S is referred to as an outer surface 103A and a side surface closer to the protective area S thereof is referred to as an inner surface 103B. In addition, a surface of the tamper resistance wall structure 100 that comes into contact with the first board 30 is referred to as a lower surface 103C and a surface that comes into contact with the second board 40 of the tamper resistance wall structure 100 is referred to as an upper surface 103D.

In the description with reference to FIGS. 4 to 6, as shown in the drawings, an axis perpendicular to the lower surface 103C (and the upper surface 103D) of the tamper resistance wall structure 100 is defined as a Z axis. An axis orthogonal to the Z axis and parallel to the outer surface 103A (and the inner surface 103B) is defined as an X axis. An axis orthogonal to the X axis and the Z axis is defined as a Y axis. The positive direction of the X axis may be referred to as "right", the negative direction of the X axis may be referred to as "left", the positive direction of the Z axis may be referred to as "upper", and the negative direction of the Z axis may be referred to as "lower". Note that the expressions relating to these directions are used for convenience of description and are not intended to limit the posture of the structure in actual use.

The wall body 101 of the tamper resistance wall structure 100 is formed of a laminated board stacked in a height direction (Z axis direction). That is, the tamper resistance wall structure 100 can be manufactured by a known method for manufacturing a laminated board. Accordingly, the tamper resistance wall structure 100 can be efficiently manufactured. The number of stacked boards of the tamper resistance wall structure 100 can be adjusted according to the height of the desired tamper resistance wall structure 100 (the length in the Z axis direction).

In a device for disposing the electronic components on the printed circuit board (for example, a chip mounter), the tamper resistance wall structure 100 can be mounted on the main surface of the first board 30 as in the case of the other electronic components 31. Therefore, the information processing device 20 including the tamper resistance wall structure 100 can be efficiently manufactured.

An end surface through-hole is formed in the outer surface 103A of the tamper resistance wall structure 100 in a direction (Z axis direction) perpendicular to the longitudinal direction (X axis direction) of the outer surface 103A. As shown in FIGS. 4 to 6, the end surface through-hole exhibits a shape obtained by cutting a circular through-hole in half in the axial direction. Hereinafter, the end surface through-hole formed in the outer surface 103A is referred to as an outer through hole 104.

The outer through hole 104A may be formed on a partial surface (hereinafter referred to as an outer wall partial surface 105A) toward the center C of the wall body 101 from one end (left end) in the longitudinal direction (X axis direction) of the outer surface 103A. The outer through hole 104B may be formed on a partial surface (hereinafter referred to as an outer wall partial surface 105B) toward the center C of the wall body 101 from the other end (right end) in the longitudinal direction (X axis direction) of the outer surface 103A. One or more outer through holes 104A, 104B may be formed in each of the outer wall partial surfaces 105A, 105B.

An end surface through-hole is formed in the inner surface 103B of the tamper resistance wall structure 100 in the direction (Z axis direction) perpendicular to the longitudinal direction (X axis direction) of the inner surface 103B. Hereinafter, the end surface through-hole formed in the inner surface 103B is referred to as an inner through hole 106.

The lands of the outer through holes 104A, 104B and the land of the inner through hole 106 are soldered to the first board 30. Thus, the tamper resistance wall structure 100 can be soldered to the first board 30 at a plurality of places on the outer surface 103A and the inner surface 103B, so that the tamper resistance wall structure 100 can be securely fixed to the first board 30.

The land of the inner through hole 106 may be used as a wiring for electrically connecting the first board 30 and the second board 40. The land of the inner through hole 106 may be used as a part of the tamper detection wiring 102 of the tamper resistance wall structure 100. That is, a signal may flow through the land of the inner through hole 106. On the other hand, the land of the outer through hole 104 may not be used as a wiring. That is, no signal flows through the land of the outer through hole 104. This is because the outer through hole 104 is exposed to the outside.

A recess 107, which is a surface recessed in a direction approaching the outer surface 103A, may be formed on a part of the inner surface 103B. One recess 107 may be formed on the inner surface 103B, or two or more recesses may be formed on inner surfaces 103B as shown in FIGS. 4 to 6. The recess 107 may be formed on the inner surface 103B at positions closer to the center C of the wall body 101 than the outer through hole 104. For example, as shown in FIGS. 4 to 6, the recess 107A may be formed at a position closer to the center C than the outer through hole 104A, and the recess 107B may be formed at a position closer to the center C than the outer through hole 104B. The inner through hole 106 may be formed in the recess 107, and the land of the inner through hole 106 may constitute a part of the tamper detection wiring 102 of the tamper resistance wall structure 100.

Thus, by forming the inner through hole 106 in the recess 107, it becomes difficult for the attacker to bring the probe into contact with the land of the inner through hole 106 from the outside. For example, even if an elongated probe is inserted through a gap Q between two tamper resistance wall structures 100 shown in FIG. 2, the attacker cannot bring the probe into contact with the land of the inner through hole 106 formed in the recess 107. That is, the attacker cannot analyze or falsify the signal flowing through the land of the inner through hole 106.

A space 108 penetrating from the upper surface 103D to the lower surface 103C may be formed on the wall body 101 of the tamper resistance wall structure 100. A switch (not shown) used to detect detachment of the first board 30 or the second board 40 is inserted into the space 108. Hereinafter, the space 108 into which the switch is inserted is referred to as a "switch space". The switch may be formed of a conductive elastic member (rubber or cushion). For example, in a state where the first board 30 and the second board 40 are attached, the switch is brought into close contact with terminals of the first board 30 and the second board 40 by an elastic force, and in an energized state. On the other hand, when the first board 30 or the second board 40 is detached, the power of the switch is cut off. Therefore, the tamper detection circuit 200 can detect the detachment of the first board 30 or the second board 40 by monitoring the power state of the switch.

As described above, the tamper resistance wall structure 100 includes the tamper detection wiring 102 in the wall body 101. The pattern of the tamper detection wiring 102 may be a pattern that reciprocates in a snake shape with a signal stroke in the upper-lower direction and covers the entire side surface in the longitudinal direction. Thus, as described above, the tamper detection circuit 200 can detect insertion and the like of the probe with respect to the tamper resistance wall structure 100. Note that the pattern of the tamper detection wiring 102 is not limited to the above, and may be, for example, a pattern that reciprocates in a snake shape with a single stroke in the left-right direction and covers the entire side surface in the longitudinal direction.

As shown in FIGS. 4 to 6, the tamper detection wiring 102 of the tamper resistance wall structure 100 may be provided between the switch space 108 and the outer surface 103A. As a result, the tamper detection circuit 200 can detect a switch inserted in the switch space 108 or a probing attack directed to the contact point of the switch.

Conclusion of Present Disclosure

The tamper resistance wall structure (100) attached to the circuit board (30) according to the present disclosure includes: a wall body (101) that is formed of a laminated board; and a tamper detection wiring (102) that is provided in the wall body and that is a pattern wiring for tampering detection. An outer through hole (104) is provided in an outer surface (103A) of the wall body, which is a side surface away from a protective area (S) on the circuit board, and is formed perpendicular to a longitudinal direction of the outer surface and perpendicular to the circuit board. An inner through hole (106) is provided in an inner surface (103B) of the wall body, which is a side surface close to the protective area on the circuit board, and is formed perpendicular to a longitudinal direction of the inner surface and perpendicular to the circuit board. According to this configuration, since the tamper resistance wall structure itself can be easily manufactured and the tamper resistance wall structure can be easily mounted on the circuit board, an information processing device having tamper proof can be efficiently manufactured.

A recess (107) is formed on the inner surface (103B), and the inner through hole (106) is formed in the recess and is a part of the tamper detection wiring. According to this configuration, probing attacks on the inner through hole become difficult.

The outer through holes (104) is formed at one end (e.g., left end) of the outer surface and the other end (e.g., right end) of the outer surface in the longitudinal direction of the outer surface (103A) respectively. According to this configuration, since the outer through holes are formed near both ends in the longitudinal direction of the outer surface, the outer through holes and the circuit board can be joined to fix the tamper resistance wall structure to the circuit board.

A switch space (108) is formed on the wall body, and is a space which penetrates from a upper surface (103D) of the wall body to a lower surface (103C) of the wall body (101). A switch, which is used for detecting the removal of the circuit board (30) or the board (40) disposed facing the circuit board, is inserted into the switch space. According to this configuration, a space for disposing the above switch can be secured.

A part of the tamper detection wiring (102) is provided between the switch space (108) and the outer surface (103A). According to this configuration, the probing attack on the switch and the contact point in the switch space can be detected.

The information processing device (20) according to the present disclosure includes at least the above tamper resistance wall structure (100) and the circuit board (30). The outer through hole (104) and the inner through hole (106) of the tamper resistance wall structure are soldered to the circuit board. According to this configuration, the information processing device (20) in which the tamper resistance wall structure is firmly fixed can be realized by soldering the outer through hole (104) and the inner through hole to the circuit board.

Although the embodiments have been described above with reference to the accompanying drawings, the present disclosure is not limited to such examples. Those skilled in the art will recognize that various changes, modifications, substitutions, additions, deletions, and equivalents may be made within the scope of the appended claims, and are understood to belong to the technical scope of the present disclosure. In addition, constituent elements in the above-described embodiments may be arbitrarily combined within a range not departing from the gist of the invention.

INDUSTRIAL APPLICABILITY

The technology of the present disclosure is useful in a device that is required to be tamper proof.

What is claimed is:

1. A tamper resistance wall structure on a circuit board comprising:
    a wall body that is formed of a laminated board; and
    a tamper detection wiring that is provided in the wall body, and that is a pattern wiring for tampering detection, wherein:
    an outer through hole is provided in an outer surface of the wall body, which is a side surface away from a protective area on the circuit board, and is formed perpendicular to a longitudinal direction of the outer surface and perpendicular to the circuit board,
    an inner through hole is provided in an inner surface of the wall body, which is a side surface close to the protective area on the circuit board, and is formed perpendicular to a longitudinal direction of the inner surface and perpendicular to the circuit board,
    a recess is formed on the inner surface, and
    the inner through hole is formed in the recess and is a part of the tamper detection wiring.

2. The tamper resistance wall structure according to claim 1, wherein:
    the outer through hole is formed at one end of the outer surface and another outer through hole is formed at another end of the outer surface in the longitudinal direction of the outer surface.

3. The tamper resistance wall structure according to claim 1, further comprising:
    a switch space that is formed on the wall body and that is a space which penetrates from a upper surface of the wall body to a lower surface of the wall body, wherein:
    a removal of the circuit board or a board placed facing the circuit board is detected by a switch inserted in the switch space.

4. The tamper resistance wall structure according to claim 3, wherein:
    a part of the tamper detection wiring is between the switch space and the outer surface.

5. The tamper resistance wall structure according to claim 1, wherein:
    the outer through hole and the inner through hole are soldered to the circuit board.

* * * * *